United States Patent
Koido

(10) Patent No.: US 9,062,371 B2
(45) Date of Patent: Jun. 23, 2015

(54) SPUTTERING TARGET-BACKING PLATE ASSEMBLY, AND ITS PRODUCTION METHOD

(75) Inventor: Yoshimasa Koido, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 685 days.

(21) Appl. No.: 13/510,065

(22) PCT Filed: Oct. 4, 2010

(86) PCT No.: PCT/JP2010/067378
§ 371 (c)(1),
(2), (4) Date: Jun. 5, 2012

(87) PCT Pub. No.: WO2011/062002
PCT Pub. Date: May 26, 2011

(65) Prior Publication Data
US 2012/0228132 A1    Sep. 13, 2012

(30) Foreign Application Priority Data

Nov. 20, 2009    (JP) .................. 2009-264554

(51) Int. Cl.
C23C 14/34    (2006.01)
B32B 15/01    (2006.01)
C21D 9/00    (2006.01)
C22C 9/00    (2006.01)
(Continued)

(52) U.S. Cl.
CPC ............ *C23C 14/3407* (2013.01); *B32B 15/01* (2013.01); *C21D 9/0068* (2013.01); *C22C 9/00* (2013.01); *C22C 19/03* (2013.01); *C22C 23/00* (2013.01); *C22F 1/02* (2013.01); *C22F 1/08* (2013.01); *C23C 14/3414* (2013.01); *H01J 37/3414* (2013.01); *H01J 37/3435* (2013.01); *H01J 37/3491* (2013.01)

(58) Field of Classification Search
CPC ...... B32B 15/01; C21D 9/0068; C22C 19/03; C22C 9/00; C22F 1/02; C22F 1/08; C23C 14/3407; C23C 14/3414; H01J 37/3435; H01J 37/3491
USPC ........................................ 204/298.12, 298.13
See application file for complete search history.

(56) References Cited

U.S. PATENT DOCUMENTS 5,244,556 A    9/1993    Inoue
5,693,203 A    12/1997    Ohhashi et al.
(Continued)

FOREIGN PATENT DOCUMENTS

JP    55-152109 A    11/1980
JP    02-267261 A    11/1990
(Continued)

*Primary Examiner* — Rodney McDonald
(74) *Attorney, Agent, or Firm* — Howson & Howson LLP

(57) ABSTRACT

A sputtering target-backing plate assembly obtained by bonding a target material of Mg to a backing plate of Cu—Cr alloy, wherein the target material and the backing plate are bonded via a layer of Ni or an alloy comprising Ni as a main component at the interface therebetween. An object of the present invention is to provide a sputtering target-backing plate assembly that is used when magnesium (Mg) is the sputtering target material, and to resolve problems inherent in magnesium (Mg) and problems related to the selection of a backing plate to be compatible with magnesium by improving the bonding strength between the target and the backing plate in order to improve the sputtering efficiency.

18 Claims, 9 Drawing Sheets

Cross-Section Structure

(51) Int. Cl.
   *C22C 19/03*  (2006.01)
   *C22C 23/00*  (2006.01)
   *C22F 1/02*   (2006.01)
   *C22F 1/08*   (2006.01)
   *H01J 37/34*  (2006.01)

(56) References Cited

U.S. PATENT DOCUMENTS

| | | |
|---|---|---|
| 6,759,143 B2 | 7/2004 | Oda et al. |
| 6,793,124 B1 | 9/2004 | Takahashi et al. |
| 7,347,353 B2 | 3/2008 | Yamakoshi et al. |
| 7,582,194 B2 | 9/2009 | Takaki |
| 8,157,973 B2 | 4/2012 | Oda et al. |
| 2007/0051624 A1 | 3/2007 | Okabe et al. |
| 2008/0116066 A1 | 5/2008 | Miyashita |
| 2008/0197017 A1 | 8/2008 | Yi et al. |
| 2009/0229975 A1 | 9/2009 | Yamakoshi |

FOREIGN PATENT DOCUMENTS

| | | |
|---|---|---|
| JP | 03-079734 A | 4/1991 |
| JP | 04-048072 A | 2/1992 |
| JP | 06-025839 A | 2/1994 |
| JP | 06-108246 A | 4/1994 |
| JP | 06-172993 A | 6/1994 |
| JP | 2000-345330 A | 12/2000 |
| JP | 2002-075221 A | 3/2002 |
| JP | 4017198 B2 | 12/2007 |
| JP | 2009-094535 A | 4/2009 |

Cross-Section Structure

No abnormality was confirmed on the inside.

Peeling occurred during the processing.
→ It is because these are not bonded or the bond strength is weak.

Cross-Section Structure

Abnormalities (red part) were confirmed throughout the outer periphery.

No abnormality was confirmed on the inside.

No abnormality such as a gap was acknowledged in the bonded part.

SPUTTERING TARGET-BACKING PLATE ASSEMBLY, AND ITS PRODUCTION METHOD

BACKGROUND

The present invention relates to a sputtering target-backing plate assembly that is used when magnesium (Mg) is the sputtering target material, and particularly relates to a sputtering target-backing plate assembly in which the bonding strength between the target and the backing plate has been increased in order to improve the sputtering efficiency, as well as to a method of producing the same.

In recent years, a magnesium (Mg) sputtering target is required for use in MRAM. A target is usually bonded to a backing plate and subject to high-power sputtering in order to improve the production efficiency, but the problems resulting from such high-power sputtering are the strength and cooling power of the backing plate itself, and the bonding strength between the backing plate and the target.

As a conventional technology, some ingenuities have been proposed for improving the bonding strength between the target and the backing plate. To introduce these proposals, for instance, there is a technology in which Ag or Ag alloy is used as the insert material upon bonding a target material of Al or Al alloy to a backing plate, these materials are loaded, and subsequently solid-phase diffusion is performed thereto (refer to Patent Document 1).

Moreover, there is a technology in that convexoconcave is concentrically formed on the bonding surface of the sputtering target and the backing plate, and they are bonded via HIP, hot press, or solid-phase diffusion bonding in an interdigitated state (refer to Patent Document 2).

Moreover, there is a technology of performing solid-phase diffusion bonding via an insert material having a lower melting point than the target when bonding a target material having a melting point of 1000° C. or higher to a backing plate (refer to Patent Document 3).

Moreover, there is a method of interposing fine copper powder between the sputtering target and the backing plate, and bonding them at a low temperature (refer to Patent Document 4).

Moreover, there is a technology of bonding the sputtering target to the backing plate, via an Al or Al-alloy spacer, based on explosion bonding or hot rolling (refer to Patent Document 5). Moreover, there is a sputtering device in which the surface area is increased by providing convexoconcave to the cooling surface of the backing plate (refer to Patent Document 6).

In these Patent Documents, the bonding method has been devised in order to increase the bonding strength between the sputtering target and the backing plate, but there is hardly any reference to the bonding strength resulting from the materials that are used as the backing plate and the target. In particular, there is no disclosure whatsoever regarding problems in the case of preparing a target from magnesium, and the means for solving such problems.

PRIOR ART DOCUMENTS

[Patent Document 1] Japanese Laid-Open Patent Publication No. H6-172993
[Patent Document 2] Japanese Patent No. 4017198
[Patent Document 3] Japanese Laid-Open Patent Publication No. H6-108246
[Patent Document 4] Japanese Laid-Open Patent Publication No. S55-152109
[Patent Document 5] Japanese Laid-Open Patent Publication No. H4-131374
[Patent Document 6] Japanese Laid-Open Patent Publication No. H6-25839

SUMMARY OF THE INVENTION

Technical Problem

An object of the present invention is to provide a sputtering target-backing plate assembly that is used when magnesium (Mg) is the sputtering target material, and to resolve problems inherent in magnesium (Mg) and problems related to the selection of a backing plate to be compatible with magnesium by improving the bonding strength between the target and the backing plate in order to improve the sputtering efficiency.

Technical Solution

In order to achieve the foregoing object, the present invention provides the following.
1) A sputtering target-backing plate assembly obtained by bonding a target material of Mg to a backing plate of Cu—Cr alloy, wherein the target material and the backing plate are bonded via a layer of Ni or an alloy comprising Ni as a main component at the interface therebetween;
2) The sputtering target-backing plate assembly according to 1) above, wherein the tensile strength of the bonded interface of the target-backing plate assembly is 3 kgf/mm$^2$ or more;
3) The sputtering target-backing plate assembly according to 1) or 2) above, wherein the layer of Ni or an alloy comprising Ni as a main component is a layer that is formed by performing vapor deposition to Ni or an alloy comprising Ni as a main component;
4) The sputtering target-backing plate assembly according to any one of 1) to 3) above, wherein the layer of Ni or an alloy comprising Ni as a main component is formed on a surface of the target material of Mg which comes into contact with the backing plate;
5) The sputtering target-backing plate assembly according to any one of 1) to 4) above, wherein the layer of Ni or an alloy comprising Ni as a main component has a thickness of 50 nm or more and 1 μm or less.
6) The sputtering target-backing plate assembly according to any one of 1) to 4) above, wherein the layer of Ni or an alloy comprising Ni as a main component has a thickness of 100 nm or more and 0.5 μm or less;
7) The sputtering target-backing plate assembly according to any one of 1) to 6) above, wherein the amount of Ni, which exists at the interface between the target material and the backing plate, per unit area is $4.5 \times 10^{-5}$ g/cm$^2$ or more and $8.9 \times 10^{-4}$ g/cm$^2$ or less;
8) The sputtering target-backing plate assembly according to any one of 1) to 6) above, wherein the amount of Ni, which exists at the interface between the target material and the backing plate, per unit area is $8.9 \times 10^{-5}$ g/cm$^2$ or more and $4.5 \times 10^{-4}$ g/cm$^2$ or less;
9) The sputtering target-backing plate assembly according to any one of 1) to 8) above, wherein the surface of the backing plate of Cu—Cr alloy is a face that was preliminarily subject to crude processing with a lathe before being bonded;
10) The sputtering target-backing plate assembly according to any one of 1) to 9) above, wherein high-purity Mg of 5N or higher is used as the target material of Mg.

11) A method of producing a sputtering target-backing plate assembly obtained by bonding a target material of Mg to a backing plate of Cu—Cr alloy, wherein the target material and the backing plate are bonded by interposing a layer of Ni or an alloy comprising Ni as a main component at the interface therebetween;

12) The method of producing a sputtering target-backing plate assembly according to 11) above, wherein the tensile strength of the bonded interface of the target-backing plate assembly is 3 kgf/mm$^2$ or more;

13) The method of producing a sputtering target-backing plate assembly according to 11) or 12) above, wherein the layer of Ni or an alloy comprising Ni as a main component is formed by performing vapor deposition to Ni or an alloy comprising Ni as a main component;

14) The method of producing a sputtering target-backing plate assembly according to any one of 11) to 13) above, wherein the layer of Ni or an alloy comprising Ni as a main component is formed on a surface of the target material of Mg which comes into contact with the backing plate;

15) The method of producing a sputtering target-backing plate assembly according to any one of 11) to 14) above, wherein the layer of Ni or an alloy comprising Ni as a main component is formed to have a thickness of 50 nm or more and 1 μm or less;

16) The method of producing a sputtering target-backing plate assembly according to any one of 11) to 14) above, wherein the layer of Ni or an alloy comprising Ni as a main component is formed to have a thickness of 100 nm or more and 0.5 μm or less;

17) The method of producing a sputtering target-backing plate assembly according to any one of 11) to 16) above, wherein the deposition amount of the layer of Ni or an alloy comprising Ni as a main component is within the range that the amount of Ni, which exists at the interface between the target material and the backing plate, per unit area becomes $4.5 \times 10^{-5}$ g/cm$^2$ or more and $8.9 \times 10^{-4}$ g/cm$^2$ or less;

18) The method of producing a sputtering target-backing plate assembly according to any one of 11) to 16) above, wherein the deposition amount of the layer of Ni or an alloy comprising Ni as a main component is within the range that the amount of Ni, which exists at the interface between the target material and the backing plate, per unit area becomes $8.9 \times 10^{-5}$ g/cm$^2$ or more and $4.5 \times 10^{-4}$ g/cm$^2$ or less;

19) The method of producing a sputtering target-backing plate assembly according to any one of 11) to 18) above, wherein the surface of the backing plate of Cu—Cr alloy is preliminarily subject to crude processing with a lathe before being bonded; and 20) The method of producing a sputtering target-backing plate assembly according to any one of 11) to 19) above, wherein high-purity Mg of 5N or higher is used as the target material of Mg.

When preparing a sputtering target-backing plate assembly by bonding a target material of Mg to a backing plate of Cu—Cr alloy, in the present invention, the target material is bonded to the backing plate via a layer of Ni or an alloy comprising Ni as a main component at the interface therebetween. The present invention thereby yields superior effects to increase the bonding strength, enable high-power sputtering, and improve the production efficiency.

DETAILED DESCRIPTION

Figure 1:
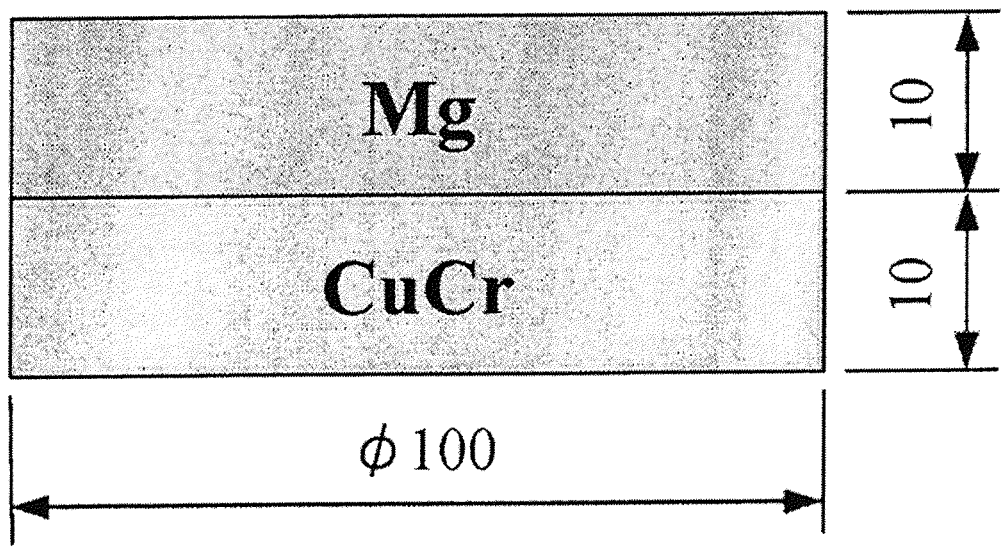
[FIG. 1] This is an explanatory diagram of the test piece structure of Comparative Example 1 in which the Mg target is directly bonded to the backing plate composed of Cu—Cr alloy.

In a sputtering device with Ar gas introduced therein, the well-known sputtering methods are: a coating method in which a voltage is applied to both the target as a cathode and the substrate as a anode, the target material is sputtered due to the impact of Ar ions on the target, and the substrate is coated with the sputtered material; or a coating method based on so-called self-sputtering in which the atoms sputtered from the target are ionized and sputtering is further performed.

In many cases, a sputtering target is bonded to a backing plate, and the sputtering device is configured to prevent the abnormal temperature increase of the target and enable stable sputtering as a result of cooling the backing plate.

In this kind of sputtering device, there is tendency of increasing the sputtering power in order to improve the production efficiency and enable high-speed sputtering. It is hardly ever the case that the backing plate and the sputtering target are made from the same material. Normally, a material with good thermal conductivity and a certain level of strength is used as a backing plate material.

In addition, the backing plate is cooled in the sputtering device so as to absorb, via the backing plate, the thermal shock that is inflicted on the target. Nevertheless, there is a limit to the foregoing cooling. A particular problem is the peeling that is caused by the difference in the thermal expansion of the target and the backing plate.

Moreover, a target is subject to erosion and it causes unevenness in its shape. When sputtering is performed at high power, it causes a phenomenon such that: the uniformity becomes aggravated because of the target deformation occurred by the thermal stress, which results from the heat generated during the sputtering, mainly being concentrated in the depressed portion; or abnormal particles will be generated by arcing with the shield to be occurred, and in an extreme case, the generation of plasma will stop.

In order to resolve the foregoing problems, measures may be considered for increasing the strength of the backing plate or changing the material thereof to alleviate the thermal stress. However, there is the problem of compatibility with Mg as the target material, and no appropriate solution has been discovered to date.

The sputtering target-backing plate assembly of the present invention is a sputtering target-backing plate assembly obtained by bonding a target material of Mg to a backing plate of Cu—Cr alloy, and the target material and the backing plate are bonded via a layer of Ni or an alloy comprising Ni as a main component at the interface therebetween. As the Cu—Cr alloy used for the backing plate, an alloy containing 0.7 to 1.2 wt % of Cr is used. This Cu—Cr alloy is a material with high strength and good thermal conductivity.

The Examples and Comparative Examples are described below. It is explained in these that Ni or an alloy comprising Ni as a main component that is used upon bonding Mg to Cu—Cr alloy yields a superior effect of being able to increase the tensile strength, and prevent the peeling during processing the assembly in which the target and the backing plate are bonded, as well as during the sputtering thereof.

It can be understood that this is an effect that is unique to a case where the target material is Mg and the backing plate is Cu—Cr alloy. With this Ni layer or alloy layer comprising Ni as a main component, no defects will arise between the target and the backing plate. This is necessary in order to increase the bonding strength.

With this sputtering target-backing plate assembly, the tensile strength of the bonded interface can be made to be 3 kgf/mm$^2$ or more. The present invention is able to provide this kind of sputtering target-backing plate assembly.

Upon forming the layer comprising Ni, as the most efficient method, such layer can be formed by performing vapor deposition to Ni or an alloy comprising Ni as a main component. Nevertheless, so as long as Ni can be interposed between the Mg target and the Cu—Cr alloy backing plate, other formation means may also be adopted. For example, it should be easy to understand that a physical vapor-deposition technique such as the sputtering method, a chemical vapor-deposition technique, or the plating method can also be used.

Moreover, the layer of Ni or an alloy comprising Ni as a main component is preferably formed on a surface of the target material of Mg which comes into contact with the backing plate so that it is uniformly and accurately coated on the target. Nevertheless, it is also possible to coat such layer on the backing plate or on both the target material and the backing plate.

Desirably, the layer of Ni or an alloy comprising Ni as a main component has a thickness of 50 nm or more and 1 μm or less. This was confirmed based on numerous experiments, but copious coating may hinder the transfer of heat to the backing plate, and therefore is undesirable from the perspective of production efficiency. Moreover, if the thickness is small, sufficient bonding strength cannot be obtained. It is particularly desirable that the layer of Ni or an alloy comprising Ni as a main component has a thickness of 100 nm or more and 0.5 μm or less.

Upon forming the layer of Ni or an alloy comprising Ni as a main component, it is desirable that the amount of Ni, which exists at the interface between the target material and the backing plate, per unit area is $4.5 \times 10^{-5}$ g/cm$^2$ or more and $8.9 \times 10^{-4}$ g/cm$^2$ or less. It is more desirable that the amount of Ni, which exists at the interface between the target material and the backing plate, per unit area is $8.9 \times 10^{-5}$ g/cm$^2$ or more and $4.5 \times 10^{-4}$ g/cm$^2$ or less. Even when using the alloy comprising Ni as a main component for the intervening layer, the Ni content is preferably within the foregoing numerical range.

In this invention, the surface of the backing plate of Cu—Cr alloy can be preliminarily subject to crude processing with a lathe before being bonded in order to further increase the bonding strength. In this case, the crude processing with a lathe is the level of being the surface roughness Ra>5 μm. Therefore, by measuring the surface roughness Ra of the lathe-processed face, a level of processing (crude processing) with a lathe can be assessed. The present invention may include these works.

Moreover, even if the foregoing Ni layer is substituted with an alloy (alloy containing 50 wt % or more of Ni) layer comprising Ni as a main component, a similar result can be expected. For example, this may also be an alloy comprising Ni as a main component, and Cr (Cr: 20 wt %, remainder Ni).

In recent years, a target material of Mg is demanded to be a high-purity Mg of 5N or higher, and this is optimal for an assembly of the sputtering target of Mg and the backing plate.

EXAMPLES

The present invention is now explained based on the Examples and the Comparative Examples. Note that these Examples are merely illustrative, and the present invention shall not be limited thereby. In other words, this invention also covers the other modes and modifications contained in the present invention.

Comparative Example 1

Comparative Example 1 is foremost explained. The target material (thickness of 10 mm, 100 mmφ) of high-purity magnesium of 5N (99.999 wt % excluding gas components) was used as a test piece. The Cu—Cr alloy (thickness of 10 mm, 100 mmφ) having the foregoing composition was used as a backing plate. The structure of the test piece is shown in FIG. 1.

After cleaning the surface, these were vacuum-sealed in a SUS foil, and then subject to HIP at a temperature of 290° C., pressure of 1450 kg/cm$^2$, and holding time of 1 hour.

Figure 2:
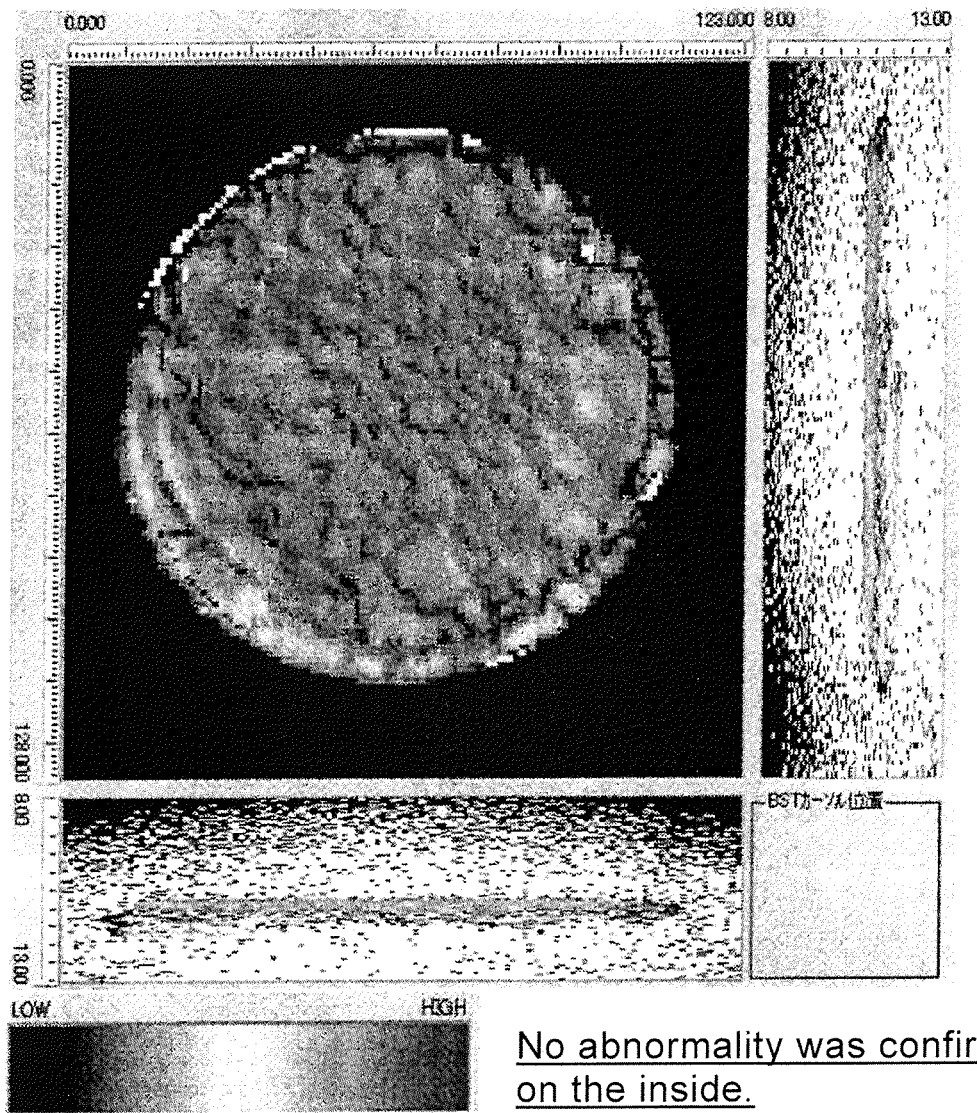
[FIG. 2] This is a diagram showing the ultrasonic inspection results of the bonded interface between the Mg target and the backing plate in Comparative Example 1.

After bonding the target to the backing plate, ultrasonic inspection was performed from the target side to observe the internal defects. In this ultrasonic inspection, no defects were observed at the interface between the target and the backing plate. The results are shown in FIG. 2.

Figure 3:
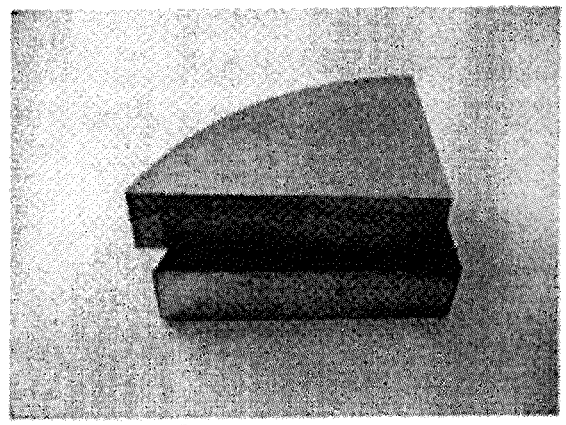
[FIG. 3] This is a diagram showing a state where peeling has occurred after processing the assembly of Comparative Example 1 in which the Mg target was bonded to the backing plate.

Nevertheless, during the process of cutting and machining this sputtering target-backing plate assembly, peeling occurred at the interface therebetween. The results are shown in FIG. 3. As evident from FIG. 3, it was confirmed that the bonding strength between Mg and Cu—Cr alloy is extremely fragile and unusable.

Moreover, in the foregoing case, a test piece in which the bonding surface of the Cu—Cr alloy was subject to crude processing using a lathe was prepared, and similar tests were performed thereto. However, the results were not so different from the foregoing results, and it was confirmed that the bonding strength between Mg and Cu—Cr alloy is extremely fragile and unusable.

Comparative Example 2

Comparative Example 2 is now explained. The target material (thickness of 10 mm, 100 mmφ) of high-purity magnesium of 5N (99.999 wt % excluding gas components) was used as a test piece. The Cu—Cr alloy (thickness 8 mm, 100 mmφ) having the foregoing composition was used as a backing plate. In addition, an Al foil of 2 mm was interposed between the target and the backing plate to obtain the test piece of Comparative Example 2.

After cleaning the surface of the target and the backing plate, these were vacuum-sealed in a SUS foil, and subject to HIP at a temperature of 290° C., pressure of 1450 kg/cm$^2$, and holding time of 1 hour.

After bonding the target to the backing plate by interposing the Al foil therebetween, ultrasonic inspection was performed from the target side to observe the internal defects. In this ultrasonic inspection, spots as defects were observed all over the interface between the target and the backing plate, and the existence of defects was confirmed.

Moreover, during the process of cutting and machining this sputtering target-backing plate assembly, peeling occurred at the interface therebetween. Consequently, it was confirmed that, under the condition where an Al layer is interposed, the bonding strength between Mg and Cu—Cr alloy is extremely fragile and unusable.

In the foregoing case, a test piece in which the bonding surface of the Cu—Cr alloy was subject to crude processing using a lathe was prepared, and similar tests were performed thereto. However, the results were not so different from the foregoing results, and it was confirmed that, under the condition where an Al layer is interposed, the bonding strength between Mg and Cu—Cr alloy is extremely fragile and unusable.

Comparative Example 3

Figure 4:
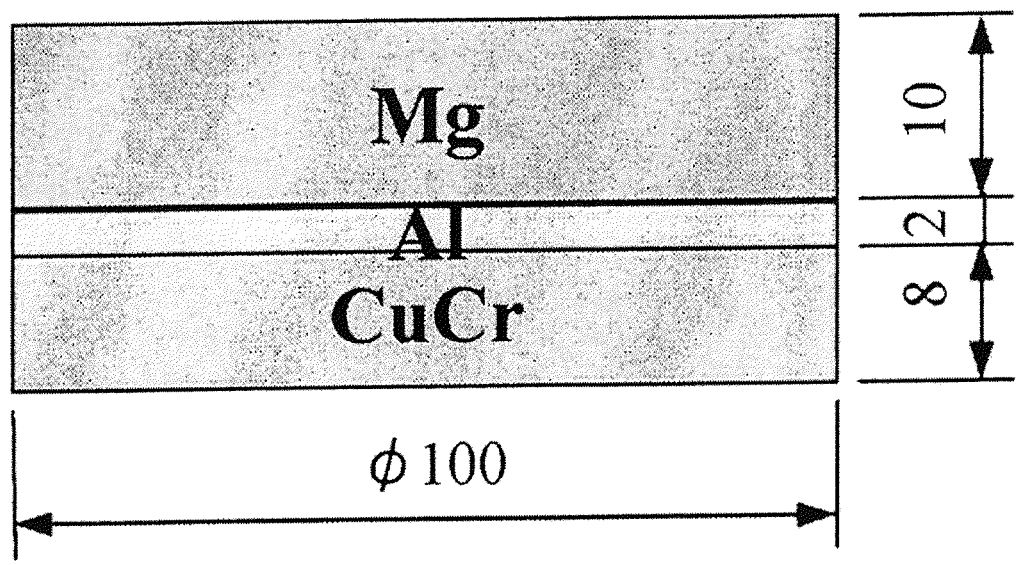
[FIG. 4] This is an explanatory diagram of the test piece structure of Comparative Example 3 in which the backing plate composed of Cu—Cr alloy and the Mg target are bonded by interposing Al and Ni therebetween.

Comparative Example 3 is now explained. The target material (thickness of 10 mm, 100 mmφ) of high-purity magnesium of 5N (99.999 wt % excluding gas components) was used as a test piece. The Cu—Cr alloy (thickness 8 mm, 100 mmφ) having the foregoing composition was used as a backing plate. In addition, an Al foil (layer) was coated on the Mg target side and Ni was coated on the Cu—Cr alloy backing plate side via vapor deposition to obtain the test piece of Comparative Example 3.The conceptual diagram of this test piece is shown in FIG. 4.

After cleaning the surface of the target and the backing plate, these were vacuum-sealed in a SUS foil, and subject to HIP at a temperature of 290° C., pressure of 1450 kg/cm$^2$, and holding time of 1 hour.

Figure 5:
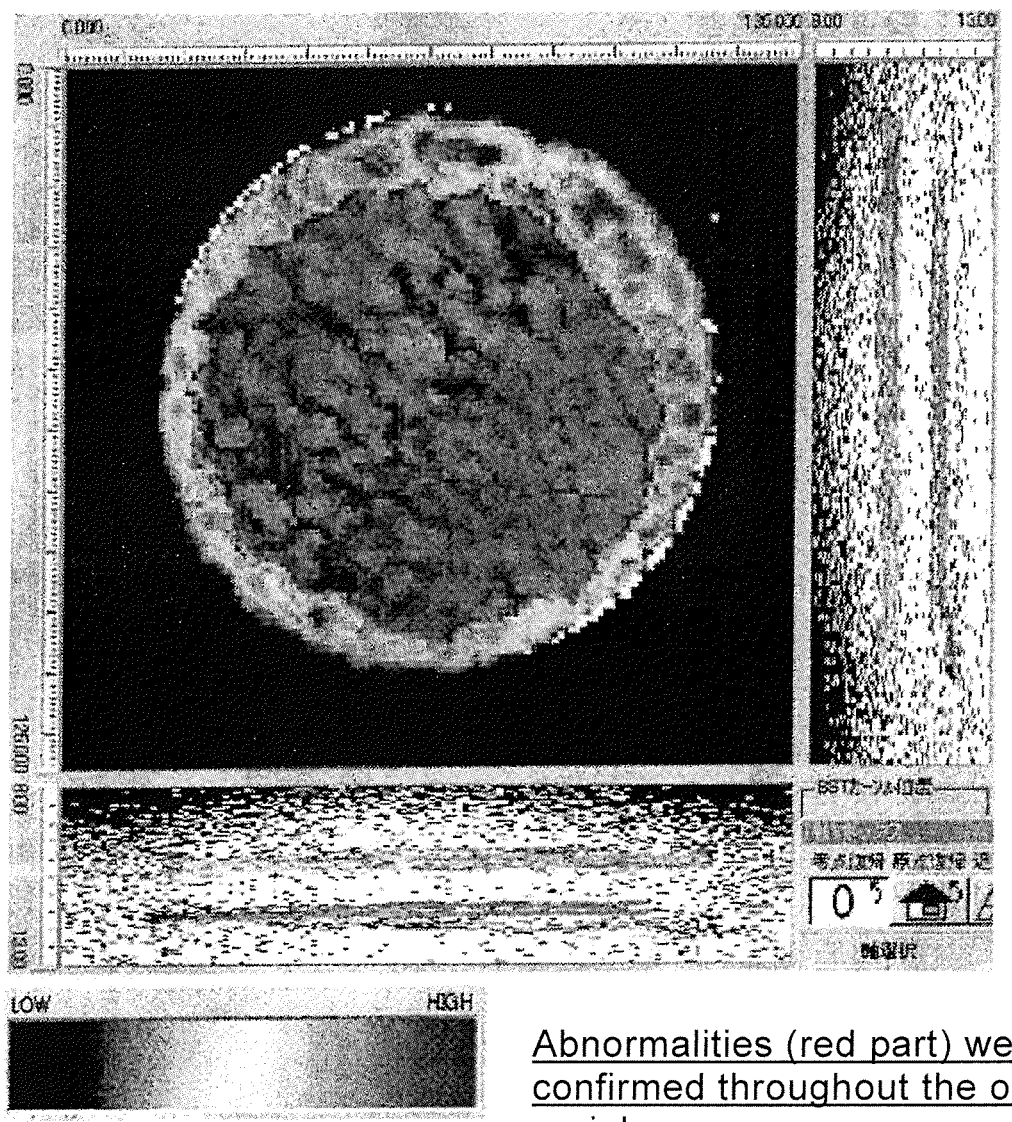
[FIG. 5] This is a diagram showing the ultrasonic inspection results of the bonded interface between the Mg target and the backing plate in Comparative Example 3.

After bonding the target to the backing plate by interposing the Al foil and Ni vapor-deposited layer therebetween, ultrasonic inspection was performed from the target side to observe the internal defects. In this ultrasonic inspection, spots as defects were observed at the interface between the target and the backing plate, particularly at the outer peripheral edge. The results are shown in FIG. 5. In this case where an Al foil (layer) was coated on the Mg target side and Ni was coated on the Cu—Cr alloy backing plate side via vapor deposition; during the process of cutting and machining this sputtering target-backing plate assembly, peeling occurred at the interface therebetween. Consequently, it was confirmed that, under the condition where an Al layer and a Ni layer are interposed, the bonding strength between Mg and Cu—Cr alloy is extremely fragile and unusable.

Moreover, in the foregoing case, a test piece in which the bonding surface of the Cu—Cr alloy was subject to crude processing using a lathe was prepared, and similar tests were performed thereto. However, the results were not so different from the foregoing results, and it was confirmed that it is not effective to interpose an Al layer on the target and a Ni layer on the backing plate, and the bonding strength between Mg and Cu—Cr alloy is extremely fragile and unusable.

Example 1

Figure 6:
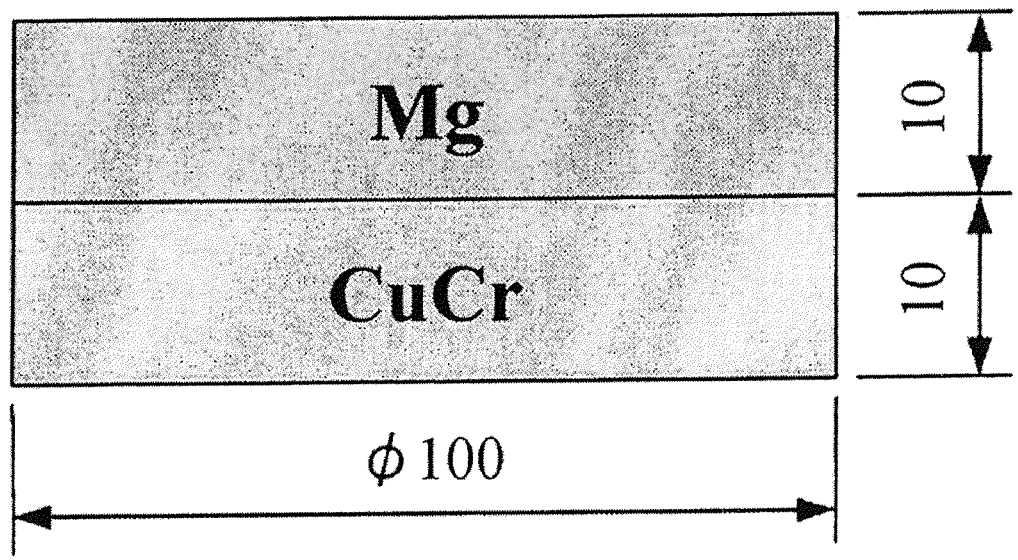
[FIG. 6] This is an explanatory diagram of the test piece structure of Example 1 in which a Ni vapor-deposited layer was interposed upon bonding the Mg target to the backing plate composed of Cu—Cr alloy.

Example 1 is now explained. The target material (thickness of 10 mm, 100 mmφ) of high-purity magnesium of 5N (99.999 wt % excluding gas components) was used as a test piece. The Cu—Cr alloy (thickness 8 mm, 100 mmφ) having the foregoing composition was used as a backing plate. In addition, a Ni coating layer having a thickness of 0.1 μm was formed on the entire area of the bonding surface on the Mg target side by subjecting Ni to vapor deposition to obtain the test piece of Example 1.The conceptual diagram of this test piece is shown in FIG. 6.

After cleaning the surface of the target and the backing plate, these were vacuum-sealed in a SUS foil, and subject to HIP at a temperature of 290° C., pressure of 1450 kg/cm$^2$, and holding time of 1 hour.

After bonding the target to the backing plate by interposing the Ni vapor-deposited layer at the interface therebetween, ultrasonic inspection was performed from the target side to observe the internal defects. In this ultrasonic inspection, no defects were observed at the interface between the target and the backing plate.

Figure 7:
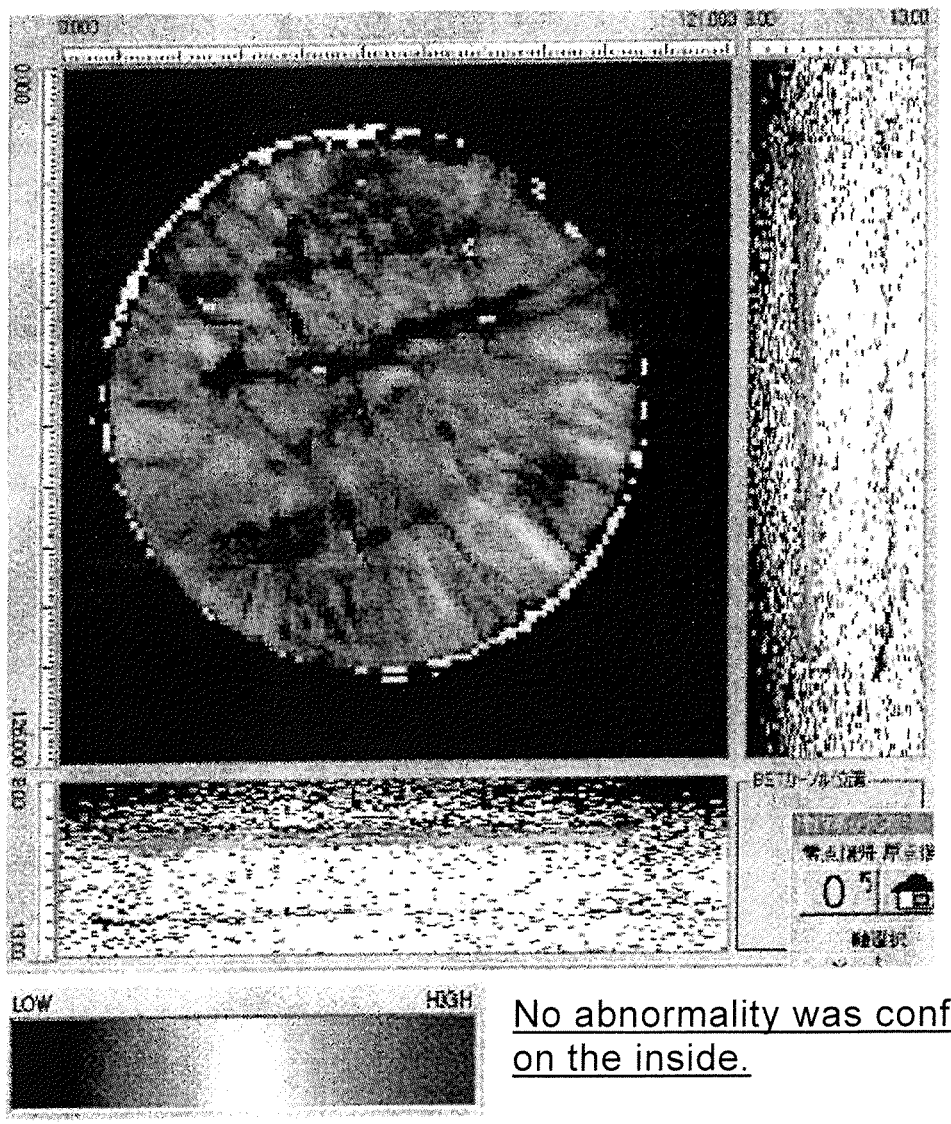
[FIG. 7] This is a diagram showing the ultrasonic inspection results of the bonded interface in which a Ni layer was interposed between the Mg target and the backing plate in Example 1.

The results are shown in FIG. 7. In this case where Ni was coated on the interface between the Mg target and the Cu—Cr alloy backing plate; during the process of cutting and machining this sputtering target-backing plate assembly, peeling from the interface therebetween did not occur at all.

Figure 8:
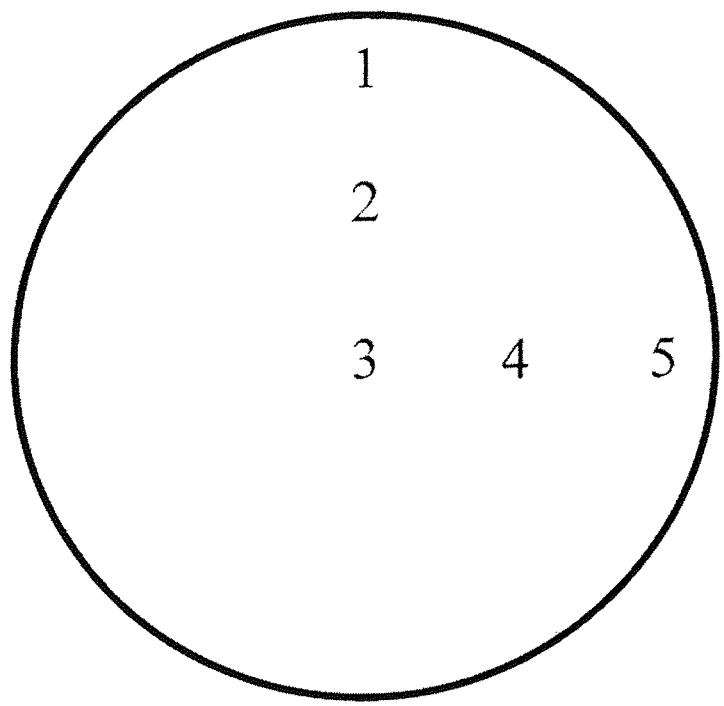
[FIG. 8] This is an explanatory diagram to show that one location from the central part, two locations from the ½R part, and two locations from the outer periphery were sampled in the sputtering target-backing plate assembly of Example 1.

Subsequently, as shown in FIG. 8, one location from the central part, two locations from the ½R part, and two locations from the outer periphery were sampled in these sputtering target-backing plate assemblies to prepare the tensile test piece shown in FIG. 9. Numbers 1 to 5 in FIG. 8 show the sampled locations. A tensile test was conducted using these samples.

The results of this tensile test are shown in Table 1.The numbers in the left column of Table 1 show the sampled locations. Consequently, the tensile strength was within the range of 3 to 6 kgf/mm$^2$, and favorable tensile strength was obtained. At all sampled locations, it was possible to achieve the bonding strength of 3 kgf/mm$^2$ or more, which is a preferred condition of the present invention.

Figure 9:
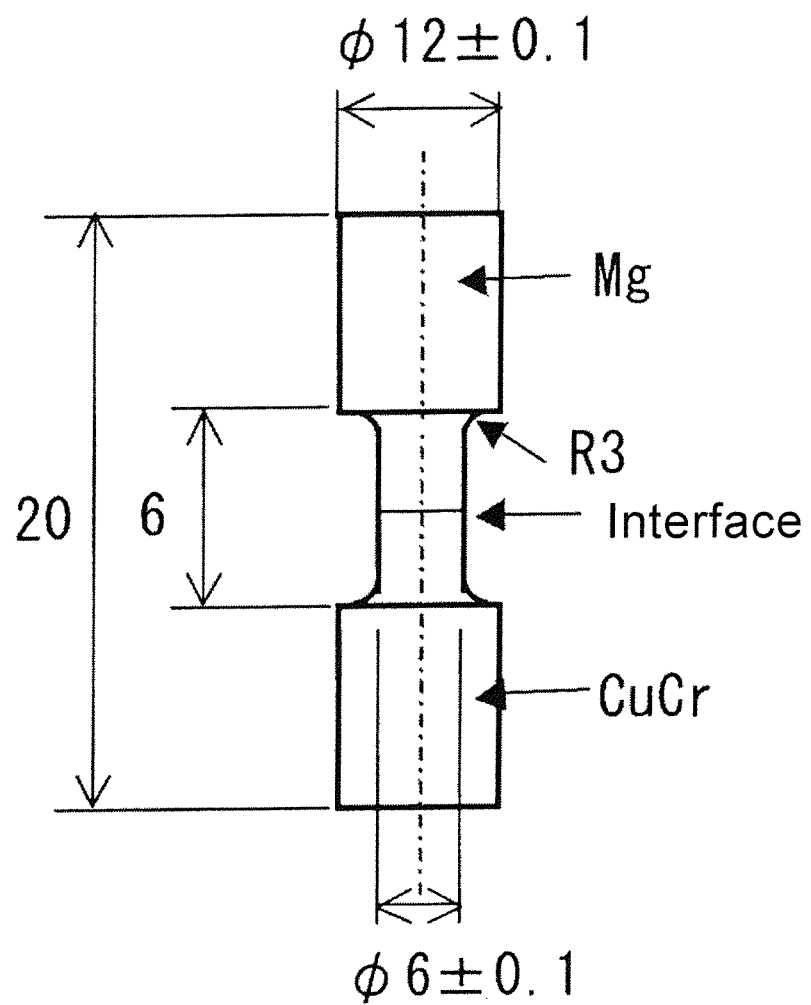
[FIG. 9] This is a diagram showing the shape of the tensile test piece which was prepared for evaluating the tensile strength of the sputtering target-backing plate assembly of Example 1.

In Example 1, the thickness of the interfacial Ni coating layer in FIG. 9 was 0.1 μm, but it was possible to obtain favorable tensile strength in all cases where the thickness of the layer of Ni is 50 nm or more and 1 μm or less.

Moreover, so as long as Ni is a main component in the interfacial coating layer, a Ni alloy comprising Ni as a main component (Ni: 50 wt % or more) can be used as a substitute for the foregoing Ni, and the similar result can be obtained.

Comparative Example 4

By way of comparison, an In bonding material having the same thickness was used upon bonding the Mg target to the Cu—Cr alloy backing plate, and the same tensile test was conducted. The tensile strength was, at maximum, roughly 1 kgf/mm$^2$, and the results were considerably inferior in comparison to the Ni coating.

TABLE 1

| | Maximum point stress (kgf/mm$^2$) |
|---|---|
| 1 | 3.90998 |
| 2 | 5.97716 |
| 3 | 4.9179 |
| 4 | 3.46077 |
| 5 | 4.1168 |

Example 2

A test piece of the sputtering target-backing plate assembly was prepared as with the above by subjecting the bonding surface of the Cu—Cr alloy to crude processing using a lathe, and the same tests were performed thereto.

Consequently, it was confirmed that the bonding strength between the target and the backing plate had further increased. Although the improvement of the bonding strength depended on the shape and quantity thereof, an improvement of roughly 10 to 50% in the bonding strength was confirmed.

Figure 10:
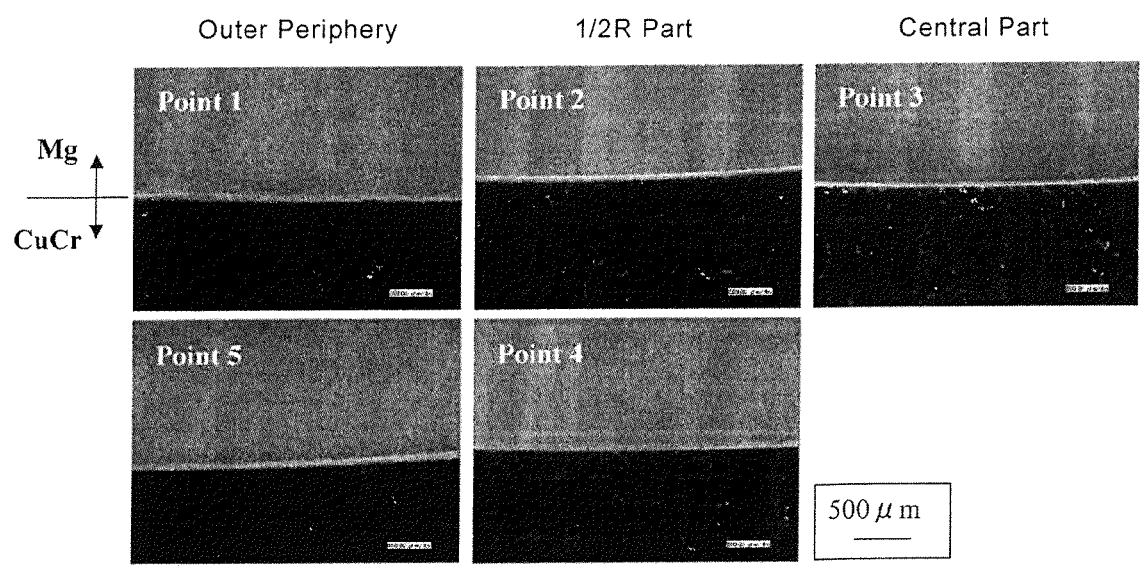
[FIG. 10] This is a diagram showing the observation result of the interface of the sputtering target-backing plate assembly of Example 2.

Subsequently, the interfacial observation was conducted as to the sputtering target-backing plate assembly. The results of observing the interface are shown in FIG. 10. One location from the central part, two locations from the ½R part, and two locations from the outer periphery were sampled, and, as shown in FIG. 10, no abnormality could be acknowledged at the interface between the Mg target and the Cu—Cr alloy backing plate.

The sputtering target-backing plate assembly of the present invention, in which a target material of Mg is bonded to a backing plate of Cu—Cr alloy by interposing a layer comprising Ni at the interface therebetween, is free from defects at the interface between the target and the Cu—Cr alloy backing plate with high strength and high thermal conductivity, and has high bonding strength, even though the target is made from Mg that is a special material. Thus, it yields superior effects of enabling high-power sputtering and improving the production efficiency, and the present invention is therefore extremely useful industrially.

The invention claimed is:

1. A sputtering target-backing plate assembly obtained by bonding a target material of high-purity Mg of 5N or higher to a backing plate of Cu—Cr alloy,
wherein the target material and the backing plate are bonded by interposing a layer of Ni or an alloy comprising Ni as a main component, which has a thickness of 50 nm or more and 1 μm or less, at the interface therebetween;
the amount of Ni, which exists at the interface, per unit area is $4.5\times10^{-5}$ g/cm$^2$ or more and $8.9\times10^{-4}$ g/cm$^2$ or less; and
the tensile strength of the bonded interface of the target-backing plate assembly is 3 kgf/mm$^2$ or more.

2. The sputtering target-backing plate assembly according to claim 1, wherein the layer of Ni or an alloy comprising Ni as a main component is a layer that is formed by performing vapor deposition to Ni or an alloy comprising Ni as a main component.

3. The sputtering target-backing plate assembly according to claim 2, wherein the layer of Ni or an alloy comprising Ni as a main component has a thickness of 100 nm or more and 0.5 μm or less.

4. The sputtering target-backing plate assembly according to claim 3, wherein the amount of Ni, which exists at the interface between the target material and the backing plate, per unit area is $8.9\times10^{-5}$ g/cm$^2$ or more and $4.5\times10^{-4}$ g/cm$^2$ or less.

5. The sputtering target-backing plate assembly according to claim 4, wherein the surface of the backing plate of Cu—Cr alloy is a face that was preliminarily subject to crude processing with a lathe before being bonded.

6. The sputtering target-backing plate assembly according to claim 1, wherein the layer of Ni or an alloy comprising Ni as a main component has a thickness of 100 nm or more and 0.5 μm or less.

7. The sputtering target-backing plate assembly according to claim 1, wherein the amount of Ni, which exists at the interface between the target material and the backing plate, per unit area is $8.9\times10^{-5}$ g/cm$^2$ or more and $4.5\times10^{-4}$ g/cm$^2$ or less.

8. The sputtering target-backing plate assembly according to claim 1, wherein the surface of the backing plate of Cu—Cr alloy is a face that was preliminarily subject to crude processing with a lathe before being bonded.

9. A method of producing a sputtering target-backing plate assembly obtained by bonding a target material of high-purity Mg of 5N or higher to a backing plate of Cu—Cr alloy,
wherein the target material and the backing plate are bonded by interposing a layer of Ni or an alloy comprising Ni as a main component, which has a thickness of 50 nm or more and 1 μm or less, at the interface therebetween;
the amount of Ni, which exists at the interface, per unit area is $4.5\times10^{-5}$ g/cm$^2$ or more and $8.9\times10^{-4}$ g/cm$^2$ or less; and
the tensile strength of the bonded interface of the target-backing plate assembly is 3 kgf/mm$^2$ or more.

10. The method of producing a sputtering target-backing plate assembly according to claim 9, wherein the layer of Ni or an alloy comprising Ni as a main component is formed by performing vapor deposition to Ni or an alloy comprising Ni as a main component.

11. The method of producing a sputtering target-backing plate assembly according to claim 10, wherein the layer of Ni or an alloy comprising Ni as a main component is formed on a surface of the target material of Mg which comes into contact with the backing plate.

12. The method of producing a sputtering target-backing plate assembly according to claim 11, wherein the layer of Ni or an alloy comprising Ni as a main component is formed to have a thickness of 100 nm or more and 0.5 μm or less.

13. The method of producing a sputtering target-backing plate assembly according to claim 12, wherein the deposition amount of the layer of Ni or an alloy comprising Ni as a main component is within the range that the amount of Ni, which exists at the interface between the target material and the backing plate, per unit area becomes $8.9\times10^{-5}$ g/com$^2$ or more and $4.5\times10^{-4}$ g/cm$^2$ or less.

14. The method of producing a sputtering target-backing plate assembly according to claim 13, wherein the surface of the backing plate of Cu—Cr alloy is preliminary subject to crude processing with a lathe before being bonded.

15. The method of producing a sputtering target-backing plate assembly according to claim 9, wherein the layer of Ni or an alloy comprising Ni as a main component is formed on a surface of the target material of Mg which comes into contact with the backing plate.

16. The method of producing a sputtering target-backing plate assembly according to claim 9, wherein the layer of Ni or an alloy comprising Ni as a main component is formed to have a thickness of 100 nm or more and 0.5 μm or less.

17. The method of producing a sputtering target-backing plate assembly according to claim 9, wherein the deposition amount of the layer of Ni or an alloy comprising Ni as a main component is within the range that the amount of Ni, which exists at the interface between the target material and the backing plate, per unit area becomes $8.9 \times 10^{-5}$ g/com$^2$ or more and $4.5 \times 10^{-4}$ g/cm$^2$ or less.

18. The method of producing a sputtering target-backing plate assembly according to claim 9, wherein the surface of the backing plate of Cu—Cr alloy is preliminary subject to crude processing with a lathe before being bonded.

* * * * *